United States Patent
Jin et al.

(10) Patent No.: US 7,253,690 B1
(45) Date of Patent: Aug. 7, 2007

(54) METHOD AND APPARATUS FOR AN LNA WITH HIGH LINEARITY AND IMPROVED GAIN CONTROL

(75) Inventors: Xiaodong Jin, Sunnyvale, CA (US); Lawrence Tse, Fremont, CA (US); King Chun Tsai, San Jose, CA (US); George Chien, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 11/650,681

(22) Filed: Jan. 8, 2007

Related U.S. Application Data (63) Continuation of application No. 11/435,995, filed on May 17, 2006, now Pat. No. 7,190,230, which is a continuation of application No. 11/049,211, filed on Feb. 2, 2005, now Pat. No. 7,088,187, which is a continuation of application No. 10/242,879, filed on Sep. 11, 2002, now Pat. No. 6,977,553.

(51) Int. Cl.
*H03F 3/04* (2006.01)
(52) U.S. Cl. ....................... 330/311; 330/296
(58) Field of Classification Search ............... 330/285, 330/296, 310, 311
See application file for complete search history.

(56) References Cited

U.S. PATENT DOCUMENTS

| | | |
|---|---|---|
| 4,296,382 A | 10/1981 | Hoover |
| 4,697,153 A | 9/1987 | Lish |
| 5,606,287 A | 2/1997 | Kobayashi et al. |
| 5,777,518 A | 7/1998 | Bailey |
| 5,789,981 A * | 8/1998 | Singer et al. ............ 330/253 |
| 5,880,631 A | 3/1999 | Sahota |
| 5,959,446 A | 9/1999 | Kuckreja |
| 6,043,709 A | 3/2000 | Shin |
| 6,166,592 A | 12/2000 | Walden |
| 6,188,093 B1 | 2/2001 | Isogai et al. |
| 6,208,177 B1 | 3/2001 | Knoedl, Jr. |
| 6,265,929 B1 | 7/2001 | Hauser |
| 6,292,034 B1 | 9/2001 | Koifman et al. |
| 6,310,512 B1 | 10/2001 | Briskin et al. |
| 6,342,816 B1 * | 1/2002 | Gradzki ................... 330/311 |

(Continued)

FOREIGN PATENT DOCUMENTS

WO WO 00/21205 4/2000

OTHER PUBLICATIONS

Behzad Razavi, "Design of Analog CMOS Integrated Circuits", McGraw-Hill Series in Electrical and Computer Engineering Mar. 23, 2001, 378-379, 392.

(Continued)

*Primary Examiner*—Henry Choe (57) ABSTRACT

A low noise amplifier (LNA) comprises a bias circuit having an output. A first transistor includes a control input that communicates with the bias circuit, a first terminal that generates a LNA output current and a second terminal. A device communicates with the second terminal of the first transistor, includes a variable resistor, and has a resistance that is modulated in response to an input signal to the LNA.

13 Claims, 5 Drawing Sheets

U.S. PATENT DOCUMENTS

| | | |
|---|---|---|
| 6,392,490 B1 | 5/2002 | Gramegna et al. ........... 330/296 |
| 6,556,022 B2 | 4/2003 | To et al. |
| 6,563,369 B1 | 5/2003 | Comer et al. ................ 327/538 |
| 6,590,456 B2 * | 7/2003 | Yang ........................... 330/311 |
| 6,600,377 B2 | 7/2003 | Sasaki ......................... 330/311 |
| 6,803,824 B2 | 10/2004 | Rategh et al. ............... 330/302 |
| 6,822,518 B1 | 11/2004 | Lin et al. .................... 330/296 |

OTHER PUBLICATIONS

Tanaka, Behbahani, Abidi, "A Linearization Technique for CMOS RF Power Amplifiers", Sep. 14, 1997 Symposlum on VLSI Digest of Technical Papers. pp. 93-94.

* cited by examiner

METHOD AND APPARATUS FOR AN LNA WITH HIGH LINEARITY AND IMPROVED GAIN CONTROL

CROSS-REFERENCE TO RELATED APPLICATIONS

This application is a continuation of U.S. patent application Ser. No. 11/435,995 now U.S. Pat. No. 7,190,230, filed on May 17, 2006 which is a continuation of Ser. No. 11/049,211 now U.S. Pat. No. 7,088,187, filed on Feb. 2, 2005 which is a continuation of Ser. No. 10/242,879 now U.S. Pat. No. 6,977,553, filed on Sep. 11, 2002. The disclosures of the above applications are incorporated herein by reference in their entirety.

TECHNICAL FIELD

An aspect of the invention relates to Metal Oxide Semiconductor Field Effect Transistor (MOSFET) amplifiers.

BACKGROUND

There is a growing demand for mobility in today's world. The rapid progress in the wireless industry makes the ubiquitous connection possible. Radio Frequency (RF) transceivers are important components for wireless devices. The majority of the RF ICs used in the wireless communication were implemented using either GaAs or silicon bipolar technologies. Not until recently, when the continuous scaling of CMOS technology brought the cutoff frequency ($f_T$) of MOS transistors up to multi-tens of GHz, were such circuits built in CMOS technology possible. The advantage of using Complementary Metal-Oxide-Semiconductor (CMOS) RF is that it can be integrated with digital functions easily. As a result, it is possible to incorporate the whole system on one single chip which yields low cost, small form factor wireless devices. A Low Noise Amplifier (LNA) is an important building block in the wireless transceiver. For LNAs, the gain linearity applied to a signal is an important operating characteristic, especially when the incoming signal is large. Under that condition, amplification by the LNA actually could be greater or smaller than one, and the noise contribution from the LNA may be negligible compared to the input signal. In fact, the linearity of the LNA becomes the most important figure of merit. Gain linearity is generally characterized as a 1 dB compression point or third order Input Intercept Point (IIP3). The gain linearity is typically related to the transconductance of a MOSFET in an input stage of the amplifier. For example, the transconductance of a MOSFET operating in the saturation region is constant only when the input signal is small. When the input signal is large, the transconductance may vary as a function of the input signal, leading to nonlinear amplification of the signal. Source degeneration may be employed at lower frequencies to increase the linearity of the input stage. However, at higher frequencies source degeneration may not be effective due to the large parasitic capacitance of the device. Also, source degeneration may increase power consumption due to the relative low gm/Id for the MOSFET in comparison with a bipolar device. In addition, Gain control is also very important in practical applications since the gain of the LNA could vary with process and temperature if not properly controlled.

SUMMARY

An LNA comprising an input stage to amplify an input signal. The LNA being particularly suitable for amplifying large input signals. The input stage includes a linearized transconductance and has reduced gain variations in response to changes in process and environmental conditions.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
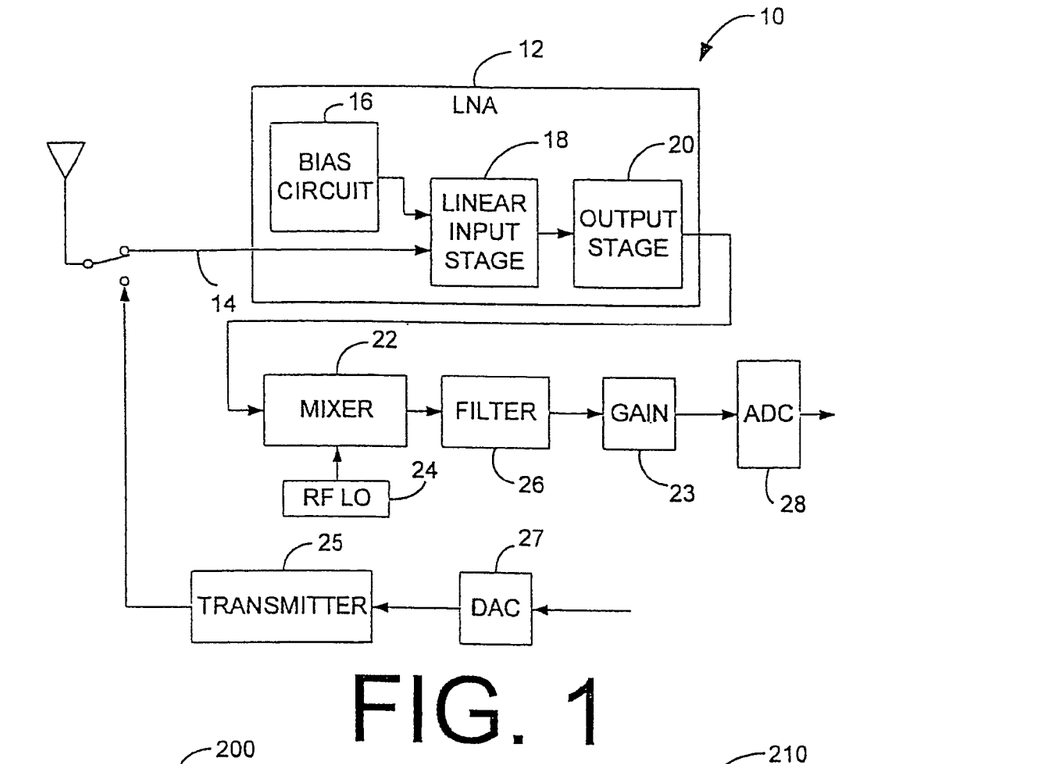
FIG. 1 is a block diagram of an aspect of a transceiver.

FIG. 1 shows an aspect of a wireless transceiver 10 for communicating information. The wireless transceiver 10 may include a Low Noise Amplifier (LNA) 12 for amplifying an input signal. An input signal 14 to the LNA 12 may be amplified by a linear input stage 18 constructed in accordance with the principles of the invention. A bias circuit 16 may supply bias signals to the linear input stage 18 in accordance with the principles of the invention. The LNA 12 preferably includes both the bias circuit 16 and the linear input stage 18. However, the LNA 12 may include the bias circuit 16 combined with a conventional linear input stage, or the linear input stage 18 combined with a conventional bias circuit. An output stage 20 may provide further amplification of the input signal.

A mixer 22 may combine the amplified input signal with a Radio Frequency (RF) LO signal 24. A filter 26 and amplifier 23 may filter and amplify the combined signal, and mix the generated signal with an Intermediate Frequency (IF) LO signal. An analog-to-digital converter (ADC) 28 may convert the mixed signal to a digital signal for further processing.

A digital-to-analog converter 27 may convert a digital signal to an analog signal for transmission by a transmitter 25.

Figure 2A:
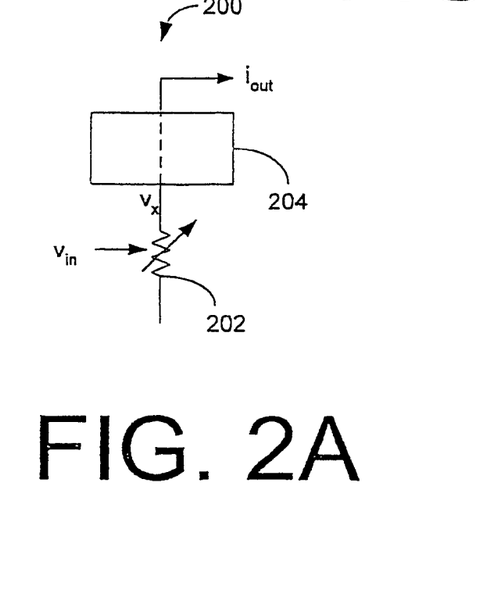
FIG. 2A is a schematic diagram of an aspect of an LNA.

FIG. 2A shows an aspect of an LNA input stage 200 for amplifying an input signal, $v_{in}$. The LNA input stage 200 may be constructed using any CMOS process including NMOS and PMOS. The input signal, $v_{in}$, to the LNA input stage 200 modulates the resistance of a first device 202 that is connected to a second device 204 having a low input impedance. Due to the low input impedance of the second device 204, the voltage $v_x$ at the junction of the first and second devices 202 and 204 may remain relatively constant.

The input stage 200 is configured so that changes in the input signal cause linearly proportional changes in conductance of the first device 202. In the case where $v_x$ is relatively constant and the conductance of the first device 202 changes in linear proportion to changes in the input signal, $i_{out}$ is about linearly proportional to $v_{in}$.

Figure 2B:
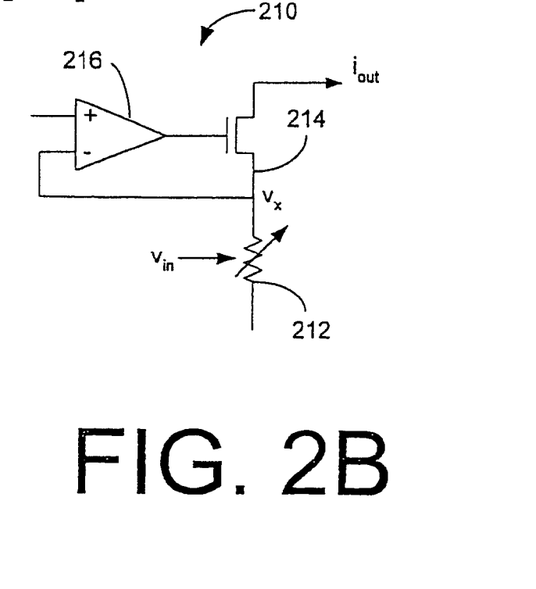
FIG. 2B is a schematic diagram of an aspect of an LNA.

FIG. 2B shows an aspect of an NMOS implementation 210 of the LNA input stage 200. The resistance of a first device 212 is modulated in response to an input signal $v_{in}$. An NMOS transistor 214 in combination with an amplifier 216 provides a low impedance at the junction of the NMOS transistor 214 and the first device 212.

Figure 2C:
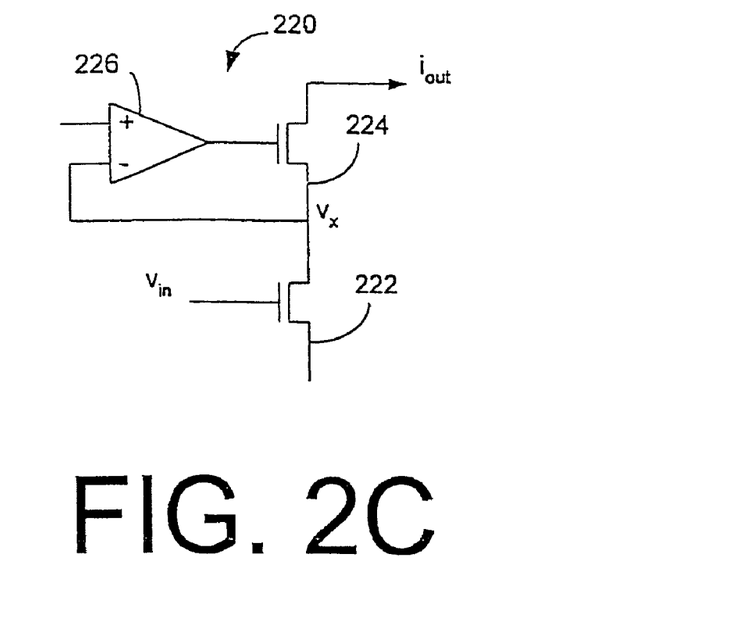
FIG. 2C is a schematic diagram of an aspect of an LNA.

FIG. 2C shows an aspect of another NMOS implementation 220 of the LNA input stage 210. Here, the resistance of a first NMOS transistor 222 is modulated in response to an input signal $v_{in}$. The first NMOS transistor is biased into the triode region. A second NMOS transistor 224 in combination with an amplifier 226 provide a low impedance at the junction of the first and second NMOS transistors 222 and 224.

Figure 2D:
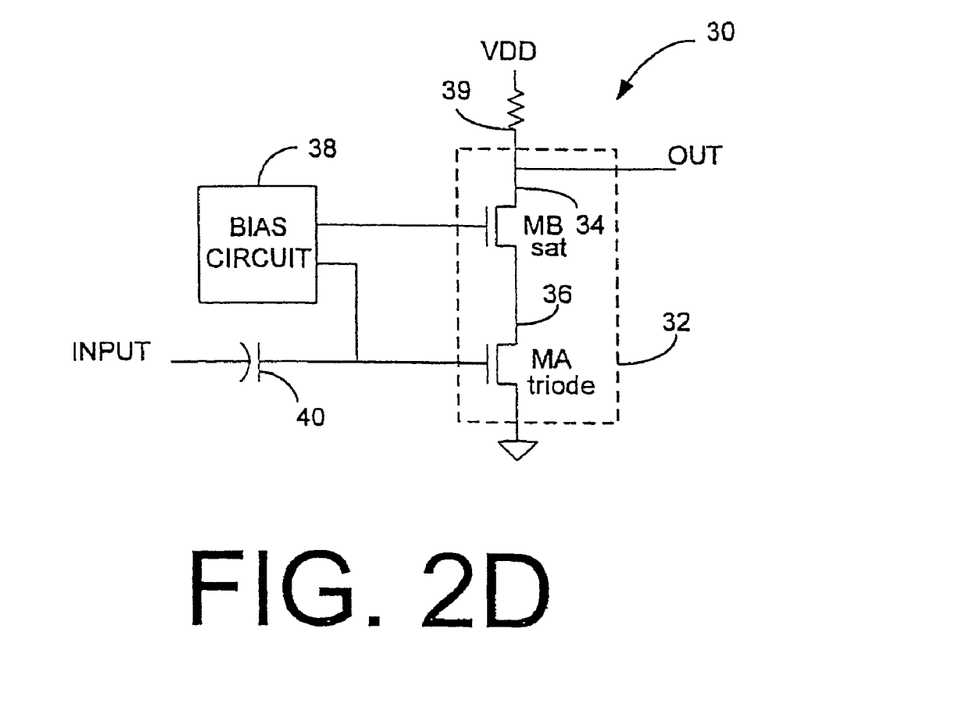
FIG. 2D is a schematic diagram of an aspect of an amplifier.

FIG. 2D shows an aspect of an amplifier 30 for amplifying an input signal in accordance with the principles of the LNA input stage 200. Here, a linear input stage 32 may include an upper MOSFET, MB, 34 and a lower MOSFET, MA, 36 connected in a cascode configuration. The input impedance of the upper MOSFET 34 at the junction of the upper and lower MOSFETs 34 and 36, may be made low relative to the lower MOSFET 36 by controlling the relative sizes of the upper and lower MOSFETs 34 and 36. The linear input stage 32 is preferably constructed as an integrated circuit using Complementary Metal Oxide Semiconductor (CMOS) technology, but other circuit technologies may also be used including discrete MOSFETs. Both NMOS and PMOS devices may be used. An input signal is AC coupled through a capacitor 40 to the gate of the lower MOSFET 36. A bias circuit 38 biases the upper MOSFET 34 into the saturation region and the lower MOSFET 36 into the triode region. Here, the lower MOSFET 36 acts as a variable resistor changing conductance in linear proportion to changes in the input signal. The impedance of the junction of MOSFETs 34 and 36 may be made lower by selecting the transconductance, $g_m$, of the upper MOSFET 34 to be larger than both $g_{ds}$ and $g_m$ of the lower MOSFET 36 so that Vds of the lower MOSFET 36 remains relatively constant over changes in the input signal. For example, an input switch ratio defined as the ratio of the size of the upper MOSFET 34 to the size of the lower MOSFET 36 may be selected to be at least four, so that $g_m$ of the upper MOSFET 34 is greater than both the $g_{ds}$ and $g_m$ of the lower MOSFET. One aspect of the invention recognizes that if the Vds of the lower MOSFET 36 is maintained relatively constant and the lower MOSFET 36 is biased into the triode region, then the output current of the lower MOSFET 36 will be linearly proportional to the input signal. The following derivation illustrates that for a device in deep triode region:

$$I_d = \mu C \frac{W}{L}\left[(V_{gs} - V_{th})V_{ds} - \frac{1}{2}V_{ds}^2\right],$$

$$g_{ds} = \frac{\partial I_d}{\partial V_{ds}} = \mu C \frac{W}{L}[(V_{gs} - V_{th}) - V_{ds}] \approx \beta(V_{gs} - V_t),$$

where $\beta = \mu C \frac{W}{L}$, the output AC current is as follows:

$$i_{out} = v_{ds}g_{ds} = \beta(V_{gs} - V_t)v_{dS}$$

Which shows that $i_{out}$ may be a linear function of the input signal, leading to an increase in linearity. The amount of linearity achieved may be controlled by adjusting the ratio of the upper MOSFET size to the lower MOSFET size. A load resistor 39 may be connected to the upper MOSFET 34. Another way of looking at it is to view the lower MOSFET 36 as a normal MOSFET which has its own transconductance gm. The following derivation illustrates that the linearity of $g_m$ may be dependent on Vds for a MOSFET operated in the triode region.

$$I_d = \mu C \frac{W}{L}\left[(V_{gs} - V_{th})V_{ds} - \frac{1}{2}V_{ds}^2\right],$$

thus the transconductance of the device is, $$g_m = \mu C \frac{W}{L}V_{ds} = \beta V_{ds}$$

The sensitivity of gm to variations in the input signal may be reduced by reducing the sensitivity of Vds to variations in the input signal, thereby increasing the linearity of the amplification.

However, since $\beta$ is function of process and temperature variation, the gain of the amplifier may vary too. One way to reduce that sensitivity is to bias the input stage so that $\beta V_{ds}$ is less sensitive to environmental variations.

Figure 3:
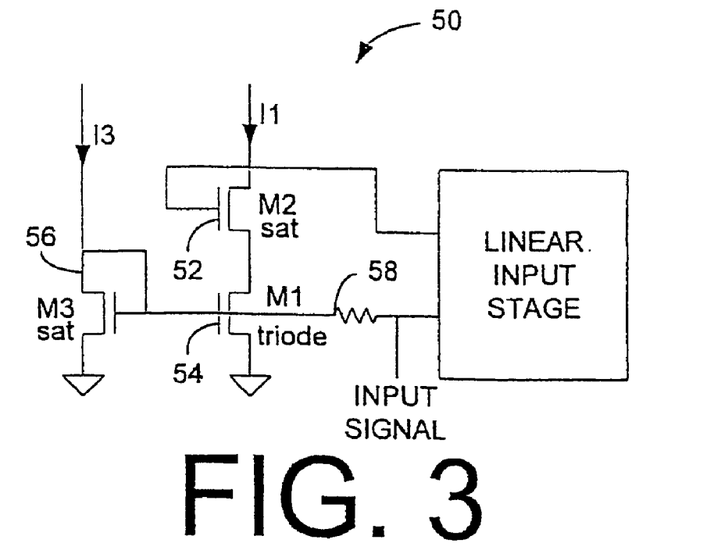
FIG. 3 is a schematic diagram of an aspect of a bias circuit for a linear input stage.

FIG. 3 shows an aspect of a bias circuit 50 for a linear input stage. The bias circuit 50 may control the variation of the linear input stage transconductance to reduce sensitivity to process, environmental effects such as temperature, and power. The bias circuit 50 includes an upper MOSFET, M2, 52 connected to a lower MOSFET M1, 54. The upper MOSFET 52 is operated in the saturation region and the lower MOSFET is operated in the triode region. A third MOSFET, M3, 56 operates to bias the lower MOSFET 52 into the triode region. To set the bias to the lower MOSFET 52, the magnitude of the current, I3, flowing through M3 56 may be controlled as well as controlling the physical characteristics of M3 56 such as size. For example, if I3 is selected to equal I1 (the current flowing through M1), then a bias switch ratio defined as the ratio of the size of M1 54 to the size of M3 56 should be selected to be at least greater than one, and preferably greater than 1.4. A resistor 58 connected from the gate of M1 56 decouples the input signal from the bias circuit 50.

Figure 4:
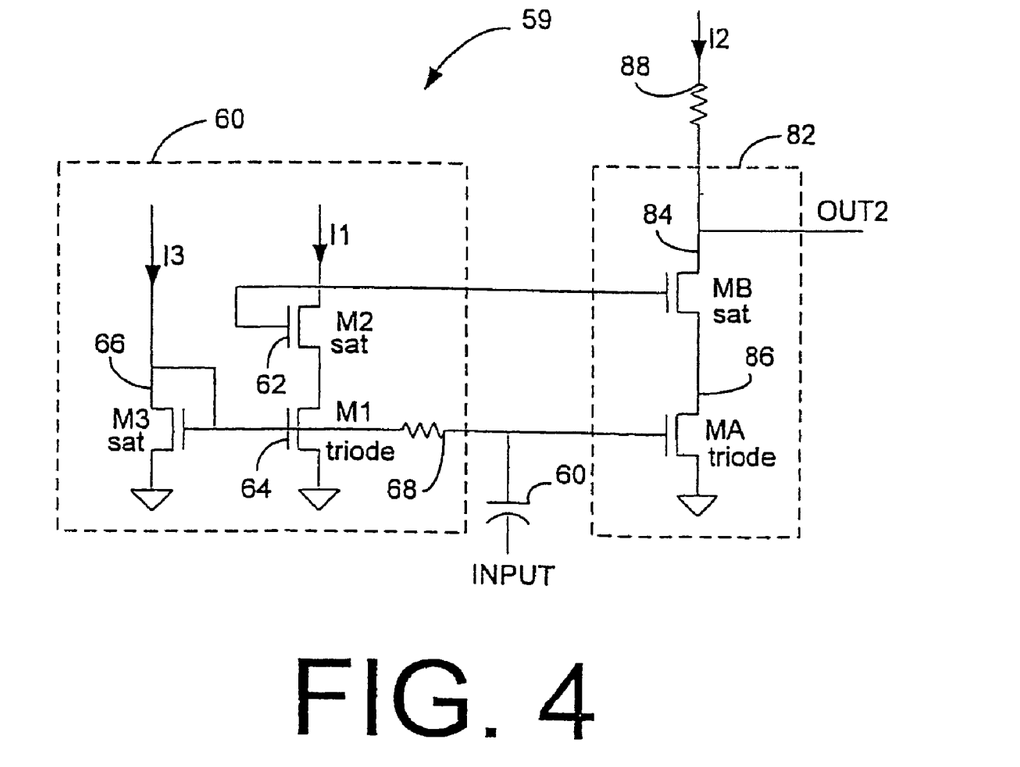
FIG. 4 is a schematic diagram of an aspect of an amplifier.

FIG. 4 shows an aspect of an amplifier 59 including a bias circuit 60 connected to a linear input stage 82. The bias circuit 60 is similar in function to bias circuit 50 with corresponding elements in the range of 62 to 68. The linear input stage 82 is similar in function to linear input stage 32 with corresponding elements in the range of 84 to 86. The amplifier 59 advantageously combines the benefits of both the linear input stage 82 and the bias circuit 60. An input signal may be AC coupled through a capacitor 60 to the gate of the lower MOSFET 86. A load resistor 88 may be connected to the upper MOSFET 84 to obtain an output from the drain of the upper MOSFET 84.

The following derivation may be used to select the devices for the linear input stage 82 and the bias circuit 60 of a preferred embodiment, and demonstrate how the gm of the input stage is controlled to be less sensitive to environ mental variations. The linear input stage transconductance, $g_{mA}$ may be as follows:

$$g_{mA} = \beta V_{ds,A} = \beta(V_b - V_{dstat,B} - V_{th,B}) \text{ where } V_b \text{ is the voltage from the gate of } MB \text{ to ground.}$$

For discussion purpose, let's assume $$\left(\frac{W}{L}\right)_2 = \left(\frac{W}{L}\right)_B, \left(\frac{W}{L}\right)_1 = \left(\frac{W}{L}\right)_A,$$

and I1=I2, then $V_{dsa,2} = V_{dsat,B}$ and $V_{th,2} = V_{th,B}$, the transconductance of MA becomes; $g_{mA} = \beta(V_b - V_{dstat,2} - V_{th,2}) = \beta V_{ds,1}$. I1 is not limited to any specific ratio of I2 as long as the ratio of $(W/L)_1$ to $(W/L)_A$ and $(W/L)_2$ to $(W/L)_B$ are properly scaled so that the current densities are about the same for those devices. The ratio of the size of M2 to the size of M1 should be approximately equal to the ratio of the size of MB to the size of MA.

For the same reason, let's assume I3=I1, and $$\left(\frac{W}{L}\right)_1 = X \cdot \left(\frac{W}{L}\right)_3,$$

where X>1.0 and preferably 14. Then M1 is also in the triode region, and if M1 in deep triode region, Vgs–Vth>>Vds/2, then $I_1 \approx \beta(V_{gs,1} - V_{th,1})V_{ds,1}$ $$g_{mA} = \beta V_{ds,1} = \beta \frac{I_1}{\beta(V_{gs,1} - V_{th,1})} = \frac{I_3}{(V_{gs,1} - V_{th,3})} = g_{m,3}/2.$$

If current I3 is a constant gm bias current which is;

$$Ids = \frac{A}{\beta},$$

where A can be chosen to only depend on an external resistor value and ratio of two transistors[1], then, $$g_{mA} = g_{m,3}/2 = \sqrt{2 \ast I_3 \ast \beta}/2 = \sqrt{A/2} \text{ which is a constant.}$$

Here, I3 does not have to equal I1, instead "X", the ratio of the size of M3 to the size of M1, can be set to a predetermined value and the ratio of I3 to I1 varied. Also, the ratios $$\left(\frac{W}{L}\right)_1$$

and $$\left(\frac{W}{L}\right)_3$$

may be varied to bias M1 into the triode region.

Figure 5:
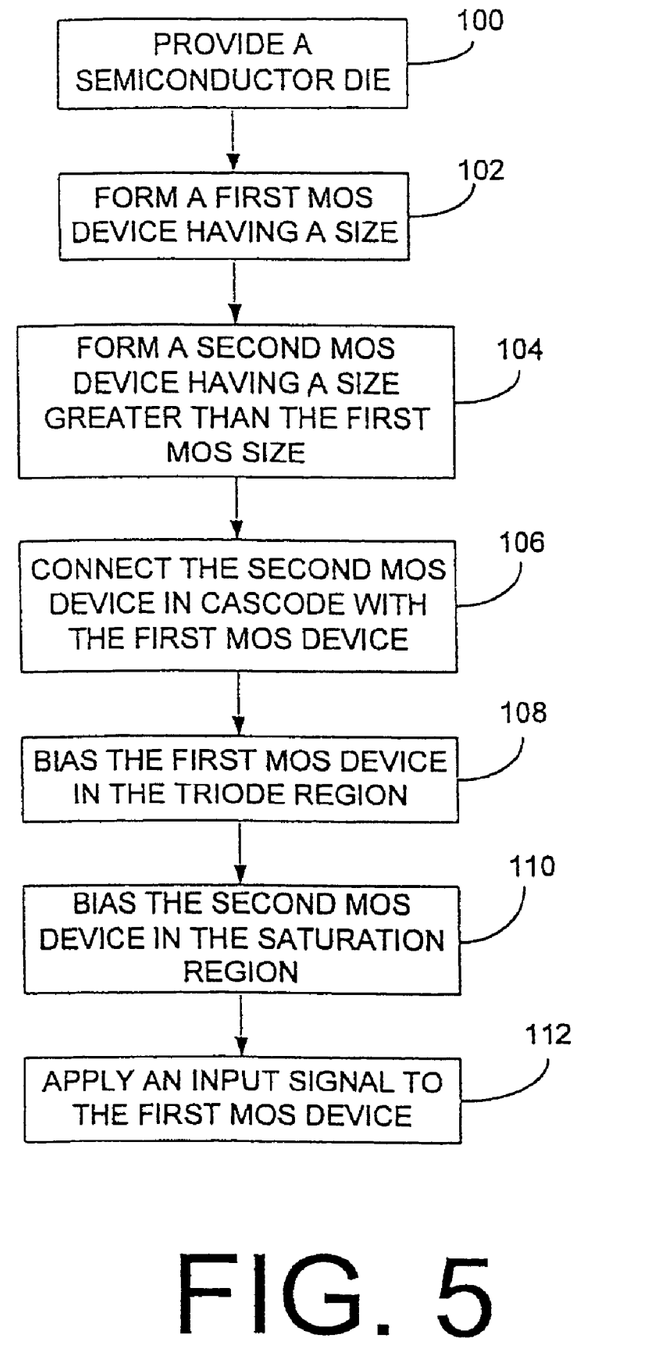
FIG. 5 is a flow diagram of an aspect of an operation for generating a linear input stage.

FIG. 5 shows an aspect of an operation for generating a linear input stage. Starting at block 100, a semiconductor die is provided. At block 102, a first MOSFET having a predetermined size is formed. At block 104, a second MOSFET having a size greater than the first MOSFET is formed. At block 106, the second MOSFET is connected in cascode with the first MOSFET. At block 108, the first MOSFET is biased into the triode region. At block 110, the second MOSFET is biased into the saturation region. At block 112, an input signal is applied to the gate of the first MOSFET causing a change in $I_d$ of the MOSFETs that is approximately a linear function of the AC voltage applied to the first MOSFET gate.

Figure 6:
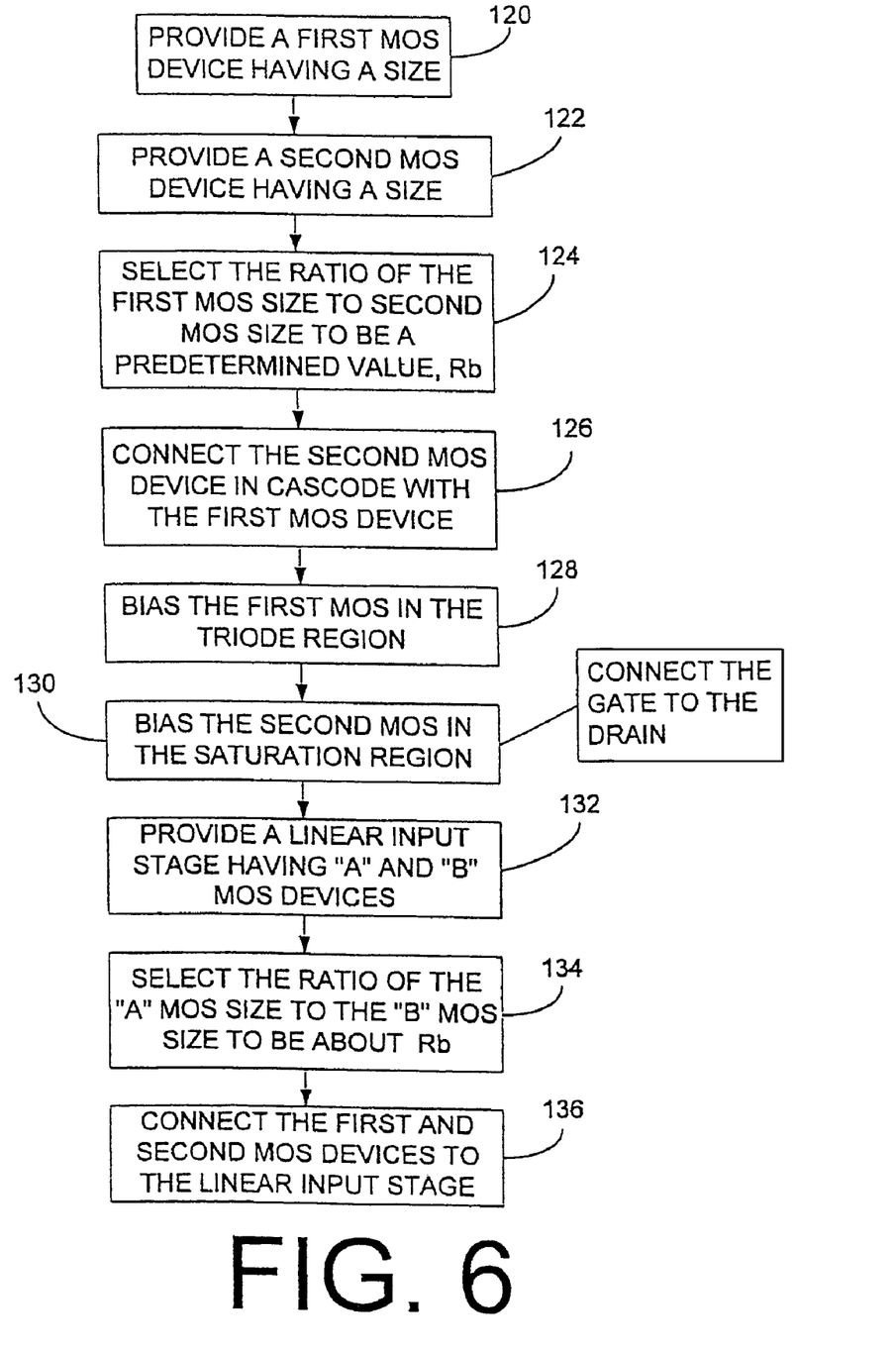
FIG. 6 is a flow diagram of an aspect of an operation for biasing a linear input stage.
Like reference symbols in the various drawings indicate like elements.

FIG. 6 shows an aspect of an operation for biasing a linear input stage. Starting at blocks 120 and 122, first and second MOS devices are provided. At block 124, the ratio of the first MOS device size to the second MOS device is selected to be a predetermined value, Rb. At block 126, the second MOS device is connected in cascode with the first MOS device. At block 128, the first MOS device is biased into the triode region. At block 130, the second MOS device is biased into the saturation region such as by connecting the gate and drain of the second MOS device together. At block 132, a linear input stage having "A" and "B" MOS devices is provided. At block 134, the ratio of the "A" MOS size to the "B" MOS size is selected to be about Rb. At block 136, the first and second MOS devices are connected to the linear input stage.

A number of embodiments of the invention have been described. Nevertheless, it will be understood that various modifications may be made without departing from the spirit and scope of the invention. Accordingly, other embodiments are within the scope of the following claims.

What is claimed is:

1. A low noise amplifier (LNA), comprising:
    a bias circuit having an output;
    a first transistor including:
        a control input that communicates with said bias circuit;
        a first terminal that generates a LNA output current; and
        a second terminal; and
    a device that communicates with said second terminal of said first transistor, that includes a variable resistor, and that has a resistance that is modulated in response to an input signal to said LNA.

2. The LNA of claim 1 wherein said bias circuit includes an operational amplifier.

3. The LNA of claim 1 wherein said first transistor includes an NMOS transistor.

4. The LNA of claim 1 wherein said device includes a second transistor.

5. A wireless transceiver comprising the LNA of claim 1.

6. The LNA of claim 1 wherein said resistance of said device changes as a function of said input signal.

7. The LNA of claim 6 wherein said resistance of said device is proportional to said input signal.

8. A low noise amplifier (LNA), comprising:
    bias means for biasing and having an output;
    a first transistor including:
        a control input that communicates with said output of said bias means;
        a first terminal that generates a LNA output current; and
        a second terminal; and
    variable resistance means for providing a variable resistance, that communicates with said second terminal of said first transistor and that includes a variable resistor, for providing a resistance that is modulated in response to an input signal to said LNA.

9. The LNA of claim 8 wherein said bias means includes an operational amplifier.

10. The LNA of claim 8 wherein said first transistor includes an NMOS transistor.

11. A wireless transceiver comprising the LNA of claim 8.

12. The LNA of claim 8 wherein said resistance of said variable resistor changes as a function of said input signal.

13. The LNA of claim 12 wherein said resistance of said variable resistor is proportional to said input signal.

* * * * *

UNITED STATES PATENT AND TRADEMARK OFFICE
CERTIFICATE OF CORRECTION

PATENT NO. : 7,253,690 B1
APPLICATION NO. : 11/650681
DATED : August 7, 2007
INVENTOR(S) : Xiaodong Jin et al.

It is certified that error appears in the above-identified patent and that said Letters Patent is hereby corrected as shown below:

Column 3, Line 60     Delete "$V_i$" and insert -- $V_t$ --
Column 5, Line 27     Delete "14" and insert -- 1.4 --

Signed and Sealed this

Thirtieth Day of October, 2007

JON W. DUDAS
*Director of the United States Patent and Trademark Office*